(12) United States Patent
Hausmann et al.

(10) Patent No.: US 6,219,219 B1
(45) Date of Patent: *Apr. 17, 2001

(54) CATHODE ASSEMBLY CONTAINING AN ELECTROSTATIC CHUCK FOR RETAINING A WAFER IN A SEMICONDUCTOR WAFER PROCESSING SYSTEM

(75) Inventors: Gilbert Hausmann, Ben Lomond; Anantha Subramani, San Jose; Peter Satitpunwaycha, Santa Clara; Raymond Gristi; Bradley O. Stimson, both of San Jose; Chia-Au Bill Lu, Irvine; Lawrance A. Ringor, Mountain View; Michael N. Sugarman, San Francisco, all of CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/163,495

(22) Filed: Sep. 30, 1998

(51) Int. Cl.$^7$ ............................................. H02N 13/00
(52) U.S. Cl. ................................................... 361/234
(58) Field of Search ................................ 361/230–235; 279/128

(56) References Cited

U.S. PATENT DOCUMENTS

| | | | |
|---|---|---|---|
| 4,412,133 | * 10/1983 | Eckes et al. | 361/234 |
| 4,520,421 | * 5/1985 | Sakitani et al. | 361/234 |
| 4,551,192 | * 11/1985 | Di Milia et al. | 156/345 |
| 5,117,121 | 5/1992 | Watanabe et al. | 307/130 |
| 5,255,153 | * 10/1993 | Nozawa et al. | 361/234 |
| 5,345,999 | 9/1994 | Hosokawa | 165/80.2 |
| 5,382,311 | * 1/1995 | Ishikawa et al. | 156/345 |
| 5,463,526 | 10/1995 | Mundt | 361/234 |
| 5,511,799 | 4/1996 | Davenport et al. | 266/236 |
| 5,530,616 | * 6/1996 | Kitabayashi et al. | 361/234 |
| 5,583,736 | 12/1996 | Anderson et al. | 361/234 |
| 5,625,526 | * 4/1997 | Watanabe et al. | 361/234 |
| 5,656,093 | * 8/1997 | Burkhart et al. | 118/728 |
| 5,745,332 | * 4/1998 | Burkhart et al. | 361/234 |
| 5,748,434 | * 5/1998 | Rossman et al. | 361/234 |
| 5,764,471 | 6/1998 | Burkhart | 361/234 |
| 5,781,400 | * 7/1998 | Takahashi et al. | 361/234 |
| 5,798,904 | * 8/1998 | Guyot | 361/234 |
| 5,923,521 | * 7/1999 | Burkhart | 361/234 |

FOREIGN PATENT DOCUMENTS

| | | | | |
|---|---|---|---|---|
| 367425 | * 10/1989 | (EP) | | H01L/21/00 |
| 0847085 | * 8/1998 | (EP) | | H01L/21/68 |

* cited by examiner

*Primary Examiner*—Ronald W. Leja
(74) *Attorney, Agent, or Firm*—Thomason, Moser and Patterson

(57) ABSTRACT

A cathode assembly having a pedestal and a detachable susceptor. Various contact assemblies containing a canted spring are utilized to make electrical connection between the pedestal and detachable susceptor. The canted spring has coils that are tilted in one direction and joined end to end to form a doughnut shape. Such a spring creates multiple parallel self-loading electrical connections via the turns of the spring. The turns act like electrical wires to ensure reliable RF electrical energy transfer. The canted spring contact of the present invention allows for flat contact between the pedestal and the chuck.

20 Claims, 5 Drawing Sheets

CATHODE ASSEMBLY CONTAINING AN ELECTROSTATIC CHUCK FOR RETAINING A WAFER IN A SEMICONDUCTOR WAFER PROCESSING SYSTEM

BACKGROUND OF THE DISCLOSURE

1. Field of the Invention

The invention relates to semiconductor wafer processing. More particularly, the invention relates to a cathode assembly with a detachable electrostatic chuck for retaining a wafer in a semiconductor wafer processing system.

2. Description of the Background Art

In semiconductor wafer processing equipment, cathode assemblies are often used as substrate supports (also known as susceptors) to retain wafers within the equipment during processing. The susceptor is typically mounted to a pedestal in a semiconductor wafer processing chamber. These susceptors find use in etching, chemical vapor deposition (CVD), physical vapor deposition (PVD) and preclean applications. In many of these applications, the susceptor contains a cathode electrode that can be biased with direct current (DC) or radio frequency (RF) voltage to enhance the process being performed in the chamber. Bias voltage is typically supplied to the cathode by an external power supply through a cable and appropriate feedthroughs. In these applications, the wafer is often subject to bombardment by energetic particles from a plasma. Such energetic bombardment heats the wafer, susceptor and pedestal to high temperatures, typically as high as 175° C. and sometimes as high as 500° C. Since excessive heating of the wafer is often undesirable, the susceptor and pedestal contain cooling mechanisms. Typically, the susceptor contains ports and surface channels for an inert backside gas that is used as a heat transfer medium between the wafer and the susceptor. Additionally, the pedestal contains a cooling plate having channels and tubes for circulating a cooling fluid such as water. The combination of backside gas and a cooling plate within the pedestal is generally sufficient to moderate the wafer temperature.

A particular type of susceptor is an electrostatic chuck. Electrostatic chucks secure a semiconductor wafer by creating an electrostatic attractive force between the wafer and the chuck. A voltage, applied to one or more insulated electrodes in the chuck, induces opposite polarity charges in the wafer and electrodes respectively. The opposite charges pull the wafer against the chuck, thereby retaining the wafer. For example, in a bipolar ceramic chuck, the wafer rests flush against the surface of a ceramic chuck body as chucking voltages of opposite polarity are applied to two chuck electrodes that are embedded in the chuck body. Because of the semiconductive nature of the ceramic material, charges migrate through the ceramic material and accumulate proximate contact points between the wafer and the surface of the chuck body. Consequently, the wafer is primarily retained upon the chuck by the Johnsen-Rahbek effect. Such a Johnsen-Rahbek chuck is disclosed in U.S. Pat. No. 5,117,121 issued May 26, 1992 and U.S. Pat. No. 5,463,526 issued Oct. 31, 1995.

An improvement in the design of susceptors is a detachable electrostatic chuck such as that shown and described in commonly assigned U.S. application Ser. No. 09/071,784 filed May 1, 1998. Such a chuck is secured to a pedestal but easily removable to facilitate repair and replacement of the chuck. Such a chuck design must incorporate a releasable electrical connection between the cathode or chucking electrodes and their respective cables.

Prior art connections made use of "banana" plugs that have a male connector with one or more resilient contact portions that fits into a cylindrical female connector. Unfortunately, repeated connection and disconnection bends the male connectors out of alignment. Consequently, the connectors apply stress to the ceramic in which they are embedded causing cracking of the ceramic. One solution to this problem, is to use spring loaded connectors. For example, commonly assigned U.S. patent application Ser. No. 09/071,784 describes a spring loaded plate that contacts the bottom of the electrostatic chuck to achieve an RF connection. Although this type of connector works well for a DC bias, the impedance of the coil spring produces a sizable voltage drop when a high frequency (e.g. 13.56 MHz) RF voltage is applied.

Also, in a plasma environment, the hardware used to secure the chuck to the pedestal is exposed to attack from energetic particles within the plasma. Furthermore, a uniform chucking force depends upon a uniform distribution of contact points between the backside of the semiconductor wafer and the chuck surface. Since the contact point distribution varies from wafer to wafer, similar wafers are not chucked in the same manner. Furthermore, wafer backside materials may vary and consequently cause differences in the chucking force across the wafer as well as from wafer to wafer. As such, the magnitude of the chucking force and its uniformity depends on wafer backside morphology and wafer backside composition.

Therefore, a need exists in the art for a cathode assembly with a detachable ceramic susceptor, suitable for use in an RF plasma environment, that reduces the chucking force dependence upon wafer backside morphology and composition.

SUMMARY OF THE INVENTION

The disadvantages associated with the prior art are overcome by the present invention of a cathode assembly having a detachable susceptor containing a pair of coplanar embedded electrodes wherein RF and DC voltages are applied to both the electrodes. The susceptor has an interconnect electrode deposited on its surface that serves as a center tap electrode to balance positive and negative voltages applied to two embedded electrodes. Pads deposited on the susceptor surface and interconnect electrode provide a minimal contact area (MCA) structure that supports a semiconductor wafer at a predefined distance above the susceptor surface. The cathode assembly comprises a pedestal and detachable susceptor secured by an electrically floating clamp ring. A ceramic skirt protects the clamp ring against plasma damage.

The electrodes are releasably coupled to RF cables through spring loaded contact assemblies in the pedestal. Each contact assembly has a resilient contact element that provides multiple parallel self-loading electrical connections between a contact plate on the bottom of the susceptor and a plunger electrode in the pedestal.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
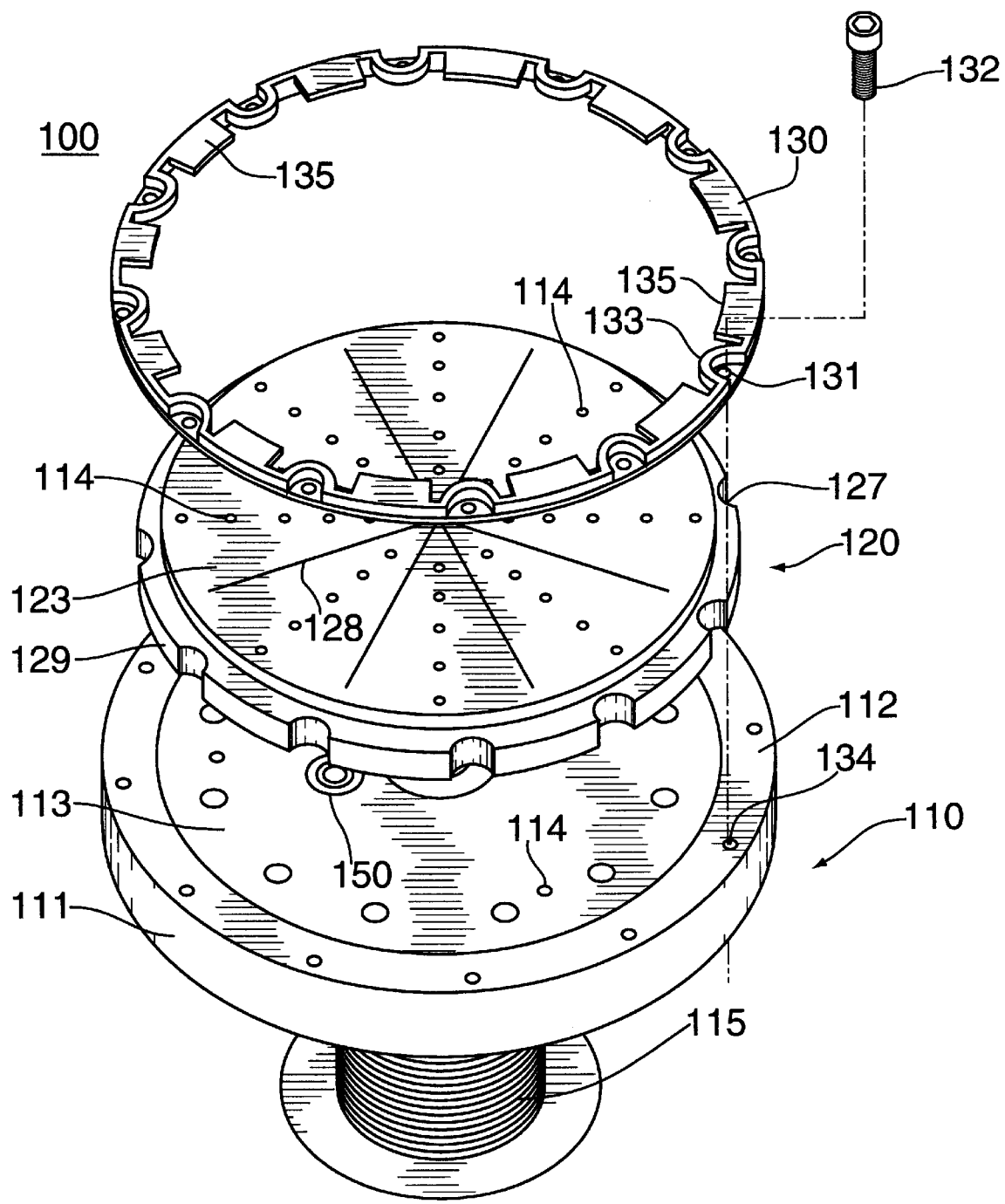
FIG. 1 is a partially exploded view of a cathode assembly of the present invention.

FIG. 1 depicts a cathode assembly 100 of the present invention. The cathode assembly 100 is best understood by simultaneously referring to FIGS. 1 and 2. The cathode assembly 100 is used during plasma processing of a semiconductor wafer 101 (FIG. 2), e.g., etching, physical vapor deposition (PVD) and plasma cleaning. The cathode assembly 100 comprises a pedestal 110 and a susceptor 120. A clamp ring 130 circumscribes and secures the susceptor 120 to the pedestal 110.

The pedestal 110 has a basin shaped piece, known as a dog dish 111, that serves as the basic structural support for the cathode assembly 100. The dog dish 111 is typically made from a robust metal such as stainless steel. A flexible bellows 115, welded to the dog dish 111, isolates a vacuum above the pedestal 110 from an atmosphere within the pedestal 110. The bellows 115 further serves to electrically ground the dog dish 111. A basin shaped insulator plate 112 sits inside the dog dish 111. The insulator plate 112 is preferably made from high strength, low dielectric constant material such as a plastic. A disk shaped cooling plate 113, disposed within the insulator plate 112, supports the susceptor 120. The insulator plate 112 electrically isolates the cooling plate 113 from the dog dish 111. An O-ring 170 disposed in an O-ring groove 171 prevents the atmosphere beneath the pedestal 110 from leaking between the dog-dish 111 and the insulator plate 112.

Figure 2:
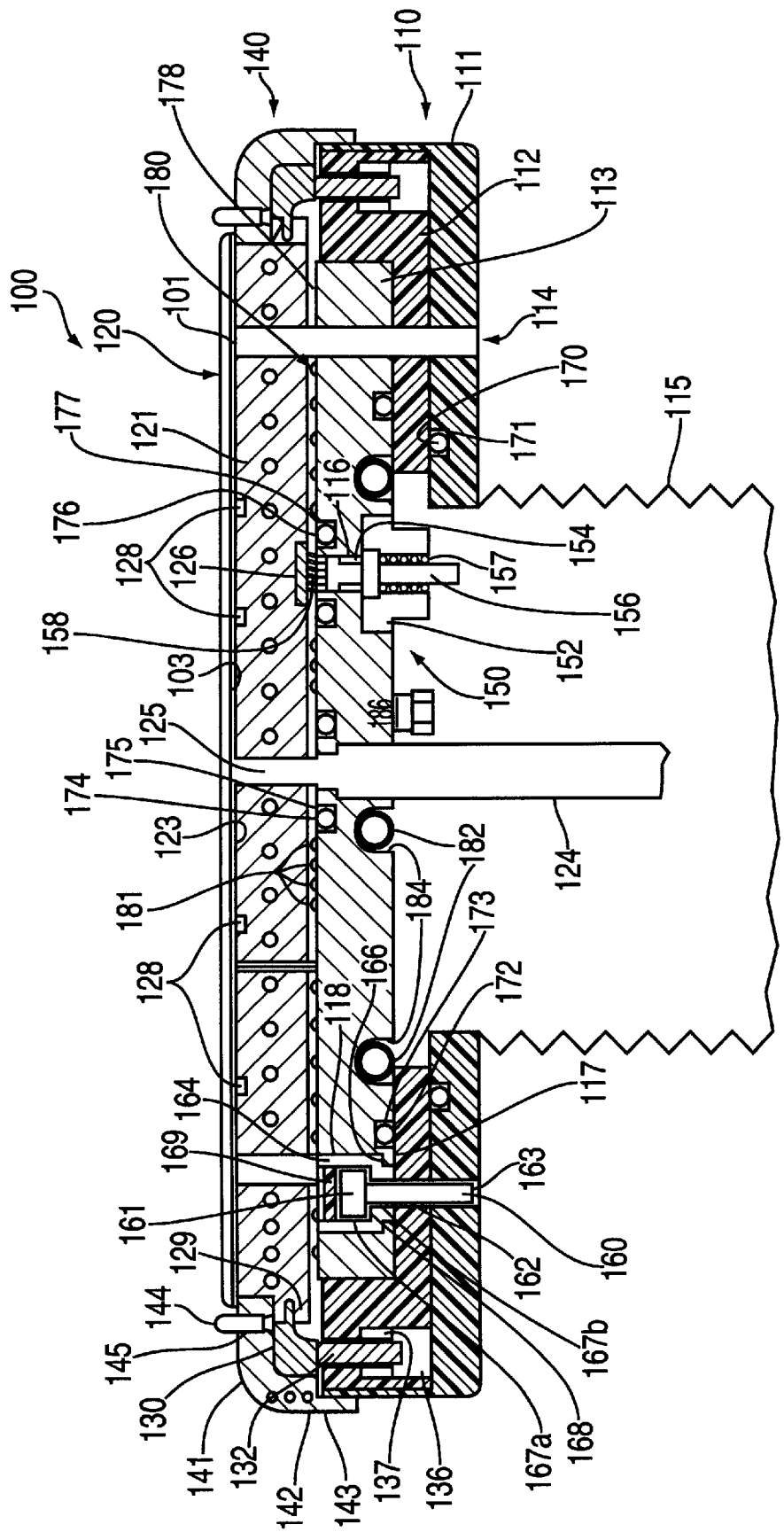
FIG. 2 is a partial cross sectional view of a semiconductor processing chamber that employs the cathode assembly of the present invention.

Details of the cooling plate 113 are shown in FIG. 2. Preferably, the cooling plate 113 is manufactured from a high thermal conductivity material such as copper. Cooling tubes 182 disposed in channels 184 carry a cooling fluid such as water or ethylene glycol. Heat from the susceptor 120 is conducted through the cooling plate and carried away by the cooling fluid. O-ring 172 disposed in an O-ring groove 173 prevents the atmosphere within the pedestal 110 from leaking between the insulator plate 112 and the cooling plate 113. A temperature sensing device such as a thermocouple 186 can be attached to the cooling plate for measuring a temperature of the pedestal 110 and/or susceptor 120.

The cooling plate 113 is secured to the pedestal 110 by a number of (e.g. 12) bolts 160. The bolts 160 fit through clearance holes 162 in the insulator plate 112 and thread into tapped holes 163 in the dog dish 111. An insulating cup 164 isolates each bolt 160 from electrical contact with the cooling plate 113. The insulating cup 164 is made from a plastic material such as Vespel®. Vespel® is a registered trademark of the Dupont Corporation of Newark, Delaware. The insulating cup 164 is received in a bore 118 in cooling plate 113. An outer shelf 166 on the cup 164 engages an inward projecting lip 117 of the bore 118. The insulating cup 164 has large and small central bores 167a and 167b respectively. A head 161 of the bolt 160 is received in the large central bore 167a and rests against an inner shelf 168 at the intersection of the large and small central bores. As each bolt 160 is tightened, the head 161 presses against the inner shelf causing the outer shelf to apply pressure to the cooling plate at the lip 117. The pressure applied to the cooling plate 113 compresses the O-rings 170 and 172. A dielectric cap 169, disposed in the large central bore 167a, covers each bolt 160 to insulate the bolt from the ceramic puck.

The susceptor 120 can be any type of susceptor typically used in a semiconductor processing chamber such as an electrostatic chuck, a mechanical chuck, a heater or a bias pedestal. The susceptor generally comprises a puck shaped body 121 made from a ceramic material such as aluminum nitride, boron nitride and the like. The ceramic body 121 has a support surface 123 and a peripheral flange 129. During use, a substrate such as a semiconductor wafer 101 rests on the support surface 123. A backside gas tube 124 and port 125 supplies backside gas that fills interstitial spaces between the wafer 101 and support surface 123 to promote thermal conductivity between the wafer and the susceptor 120. Backside gas flows through channels 128 in the support surface 123. The channels 128 fan out radially from the gas port 125. The channels 128 are between approximately 1 and 2 millimeters wide and approximately 100 microns deep. An O-ring 174 disposed in an O-ring groove 175 in the cooling plate 113 prevents backside gas from leaking between the cooling plate 113 and the susceptor 120.

Figure 3:
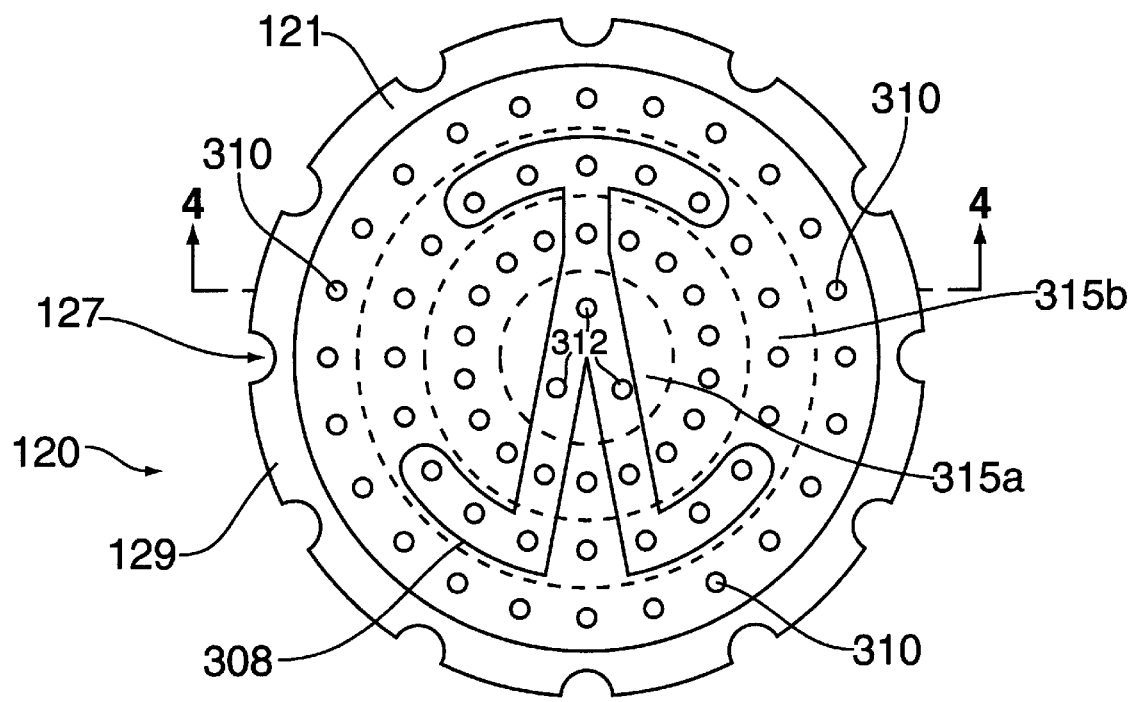
FIG. 3 is a plan view of a ceramic susceptor of the cathode assembly of the present invention.
Figure 4:
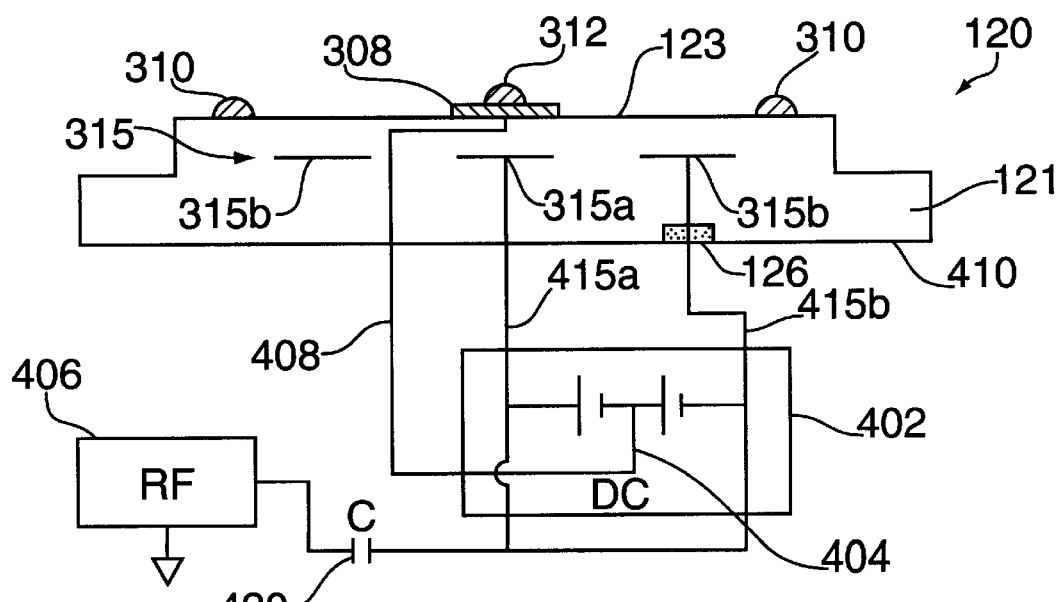
FIG. 4 is a cross sectional view of the ceramic susceptor taken along line 4—4.

Further details of the susceptor are depicted in FIGS. 3 and 4. In particular, one or more electrodes 315 are embedded in the ceramic body 121 of the susceptor 120. In a preferred embodiment of the invention, the susceptor 120 is a bipolar electrostatic chuck having two chuck electrodes 315 that, together, also serve as a cathode. Specifically, the electrodes 315 comprise an inner circular electrode 315a and an outer ring shaped electrode 315b shown in phantom in FIG. 3.

The support surface 123 has a number of pads 310 that support the wafer 101 (not shown) while providing minimal contact area (MCA) with the wafer backside 103. The MCA pads 310 rise approximately 2.5 microns above the support surface 123. The pads 310 are typically fabricated from a material different from that of the support surface 123. Exemplary materials include titanium, titanium nitride, stainless steel and the like. Certain pads 312 are connected by an interconnect electrode 308 that lies on top of the support surface 123. The pads 312 on top of the interconnect electrode 308 provide multiple points of contact to the wafer. Such pads are described in commonly assigned U.S. Pat. No. 5,656,093, issued Aug. 12, 1997 which is incorporated herein by reference.

The interconnect 308 is typically made of titanium and has a thickness of approximately 0.5 microns. The interconnect 308 is typically fabricated (in plan view) in the shape of two J-shaped hooks with their respective shanks joined back to back. Such a shape evenly distributes the connected pads 312 over the support surface 123 and ensures that at least one connected pad 312 provides a point of electrical contact between the backside 103 of the wafer 101 and the interconnect 308 if the wafer 101 is bowed. For example, if the wafer 101 is bowed higher at the center than at the rim, at least one MCA pad 312 near the rim will make contact with the backside 103 of the wafer 101. If the wafer 101 is bowed higher at the rim than at the center, at least one MCA pad 312 near the center will make contact with the backside 103 of the wafer 101.

A DC power supply 402 biases the inner electrode 315a with respect to the outer electrode 315b. A center tap 404 of the power supply 402 is coupled to the interconnect electrode 308 to balance the electrostatic force applied to the wafer 101. This type of force balancing is disclosed in commonly assigned U.S. Pat. No. 5,764,741, issued Jun. 9, 1998. Specifically, the power supply 402 biases the inner electrode 315a between 200 and 400 volts positively with respect to the interconnect 308. The outer electrode is biased an equal amount negatively with respect to the interconnect 308. An RF power supply 406 biases the embedded electrodes 315a and 315b with a signal having a frequency of approximately 13.56 MHz. The RF supply 406 is connected to the electrodes 315a and 315b through a blocking capacitor 420.

The electrodes 315a, 315b and 308 are coupled to the power supplies 402 and 406 by conductive rods 415a, 415b and 408 respectively. Each electrode is electrically coupled to its respective cable by a contact plate 126 located on a bottom surface 410 of the susceptor 120. Referring back to FIG. 2, the contact plate 126 is coupled to an electrical contact assembly 150 disposed in a bore 116 in the cooling plate 113. The contact assembly is designed to facilitate both good electrical contact and quick removal of the susceptor 120. Such a contact assembly is disclosed in commonly assigned U.S. patent application Ser. No. 09/126,859, filed Jul. 31, 1998 which is incorporated herein by reference. An O-ring 176, disposed in an O-ring groove 177 in the cooling plate 113 radially adjacent the bore 116, prevents the atmosphere within pedestal 110 from leaking between the cooling plate 113 and the susceptor 120.

Each contact assembly 150 (only one of three is shown) comprises an insulating housing 152 an insulating sleeve 154, a plunger electrode 156 and a toroidal canted spring 158. The housing 152 and sleeve 154 circumscribe the plunger electrode 156 to electrically isolate it from the cooling plate 113. A coiled spring 157 urges the plunger electrode towards the contact plate 126. The canted spring 158 forms a plurality of electrically parallel self loading electrical contacts between the plunger electrode 156 to the contact plate 126 when the two are pressed together. The electrical connection between the plunger electrode 156 and the contact plate 126 has a low impedance. The low impedance reduces the RF voltage drop across the connection, thereby improving the efficiency of RF energy transfer and reducing the likelihood of arcing.

Figure 5:
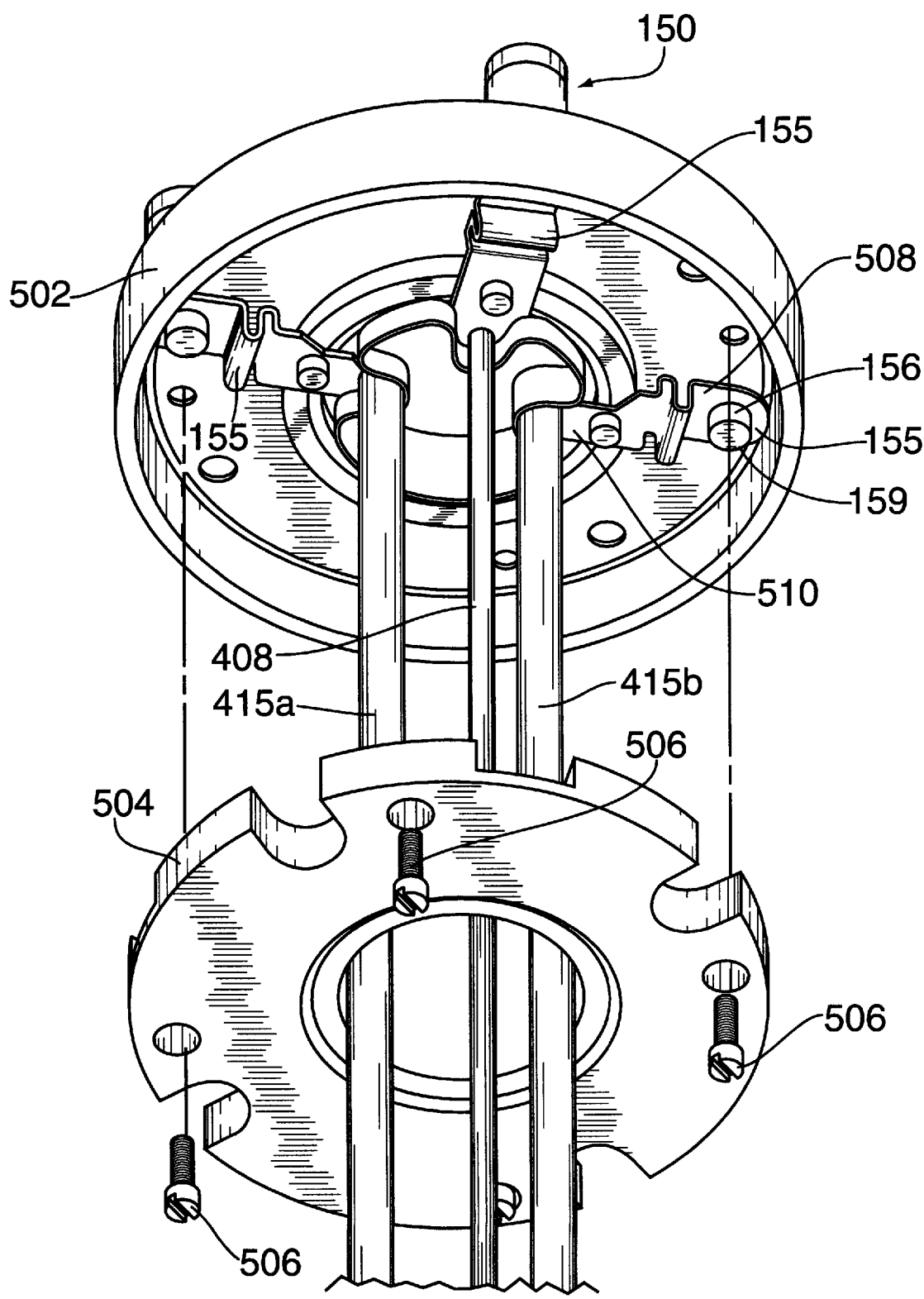
FIG. 5 is a partially exploded view showing the contact assembly of the cathode assembly of the present invention.

Further details of the electrical connection of the subject invention are depicted in FIG. 5. A resilient contact strip 155 couples each plunger electrode 156 to its respective RF cable 415a, 415b or 408 while allowing for movement of the plunger electrode. The RF cables and resilient contact strips 155 are fixed in a contact housing 502 disposed below the pedestal 110. The contact strip is made from a highly conductive resilient material such as beryllium copper. A first end 508 of the contact strip 155 is attached to the plunger electrode by screw 159. A second end 510 of the contact strip 155 is soldered to one of the conductive rods 415a, 415b or 408. A cover plate 504 protects the resilient contacts 155. The contact housing and cover plate are typically made of a dielectric material such as plastic. Conventional means such as bolts 506 secure the cover plate to the contact housing 502.

Thermal contact between the cooling plate 113 and the susceptor 120 is enhanced by a foil 180 situated on top of the cooling plate 113. The foil is made from a thermally conducting material such as copper. A plurality of bumps 181, embossed in the foil 180, enhance the thermal contact between the susceptor 120 and the cooling plate 113. The bumps 181 provide a plurality of points of contact for heat transfer and close a gap 178 necessitated by the O-rings 174 and 176. The O-rings 174 and 176, foil 180 and canted spring 158 are compressed by a force applied to the susceptor by the clamp ring 130. Under operating conditions, the gap 178 is evacuated and the only path for significant conductive heat transfer between the susceptor 120 and the cooling plate 113 is through the foil 180. Note that for clarity of the invention and ease of viewing, the gap 178 and bumps 181 shown in FIG. 2 appear much larger than they actually are.

Referring to FIGS. 1 and 2, the clamp ring 130 engages the peripheral flange 129 of the susceptor 120 to secure the susceptor 120 to the pedestal 110. The clamp ring 130 is secured to the insulator plate 112 without physically contacting the dog dish 111. As such, the clamp ring 130 is electrically isolated from ground. A plurality of bolts 132 (only one shown in FIG. 1 for clarity) extend through a corresponding plurality of clearance holes 131 in a plurality of inward projecting portions 133 of the clamp ring and a corresponding plurality of clearance holes 134 in the insulator plate 112. Cutouts 127 on the flange 129 accommodate the inward projecting portions 133. The clearance holes 134 have counterbores 136 as seen in FIG. 2 that receive nuts 137. The bolts 132 thread into the nuts 137. A plurality of resilient fingers 135 extend radially inward from the clamp ring 130 between the clearance holes 131. When the bolts 132 are tightened, the resilient fingers 135 engage the flange 129 and bend, thereby exerting a compressive force on the flange 129. The compressive force on the flange 129 causes the susceptor 120 to compress the foil 180 against the cooling plate 113 and the cooling plate 113 against the insulator plate 112. The bumps 181 on the foil 180 are thereby compressed ensuring good thermal contact between the cooling plate 113 and the susceptor 120. The insulator plate 112 must be made from a material having a sufficient resilience and mechanical strength to accommodate the compressive force without cracking or permanently deforming. Suitable materials include high strength plastics such as polyetheretherketone (PEEK) and polyaryletherketone, also called PEEK™. PEEK™ is a trademark of Victrex plc, of Thornton Cleveleys, UK.

Energetic ions from a plasma can damage the clamp ring 130, bolts 132, and susceptor 120. These parts of the cathode assembly 100 are circumscribed by a skirt 140 to protect said parts from exposure to plasma. The skirt 140 is made from a ceramic material such as alumina. The skirt 140 is in the shape of a ring with a horizontal roof 141 that transitions into a downward projecting sidewall 142. The sidewall 142 protects the clamp ring 130 and flange 129 of the susceptor 120 against plasma attack from the side. The sidewall 142 has an extension 143 that partially covers the dog-dish 111 thereby protecting any gap between the pedestal 110 and the susceptor 120. The roof 141 protects the clamp ring 130 and bolts 132 against plasma attack from above and from the side. A number of (e.g. four) retaining pins 144 are received in a corresponding number of holes 145 in the roof 141 of the skirt 140. The retaining pins 144 restrict horizontal motion the wafer 101. Alignment of the level of support surface 123 with the horizontal roof 141 of the skirt 140 is very critical. The support surface must be aligned to prevent plasma attack of an overhanging portion of the wafer 101. Alignment can be adjusted by, for example, custom made spacers that rest on the flange 129, shims under the skirt 140 or a screw mechanism. Ideally the support surface 123 and the horizontal roof 141 of the skirt 140 are coplanar.

Figure 6:
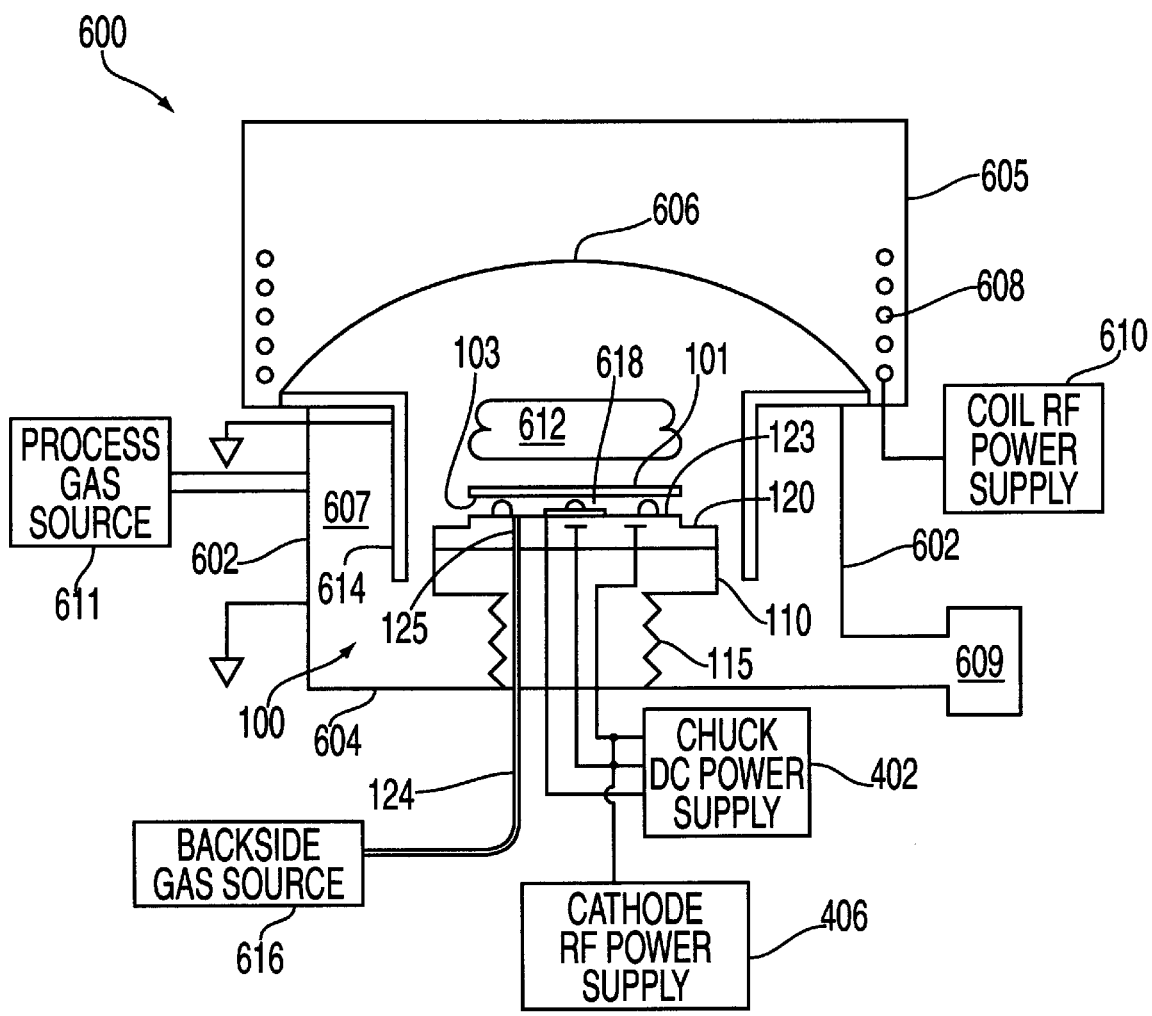
FIG. 6 depicts a schematic drawing of a semiconductor wafer processing chamber that employs the cathode assembly of the present invention.

The cathode 100 assembly is situated within a process chamber 600 schematically depicted in FIG. 6. The process chamber 600 is, for example, a Preclean II/e chamber manufactured by Applied Materials of Santa Clara, Calif. The susceptor 120 supports the wafer 101 during plasma cleaning. The process chamber 600 generally comprises a set of walls 602, a floor 604 and a domed lid 606 that define a volume 607. The chamber walls 602 and floor 604 are typically made of aluminum. The lid 606 is typically made of quartz. An exhaust system 609 controls pressure in the volume 607. The cathode assembly 100 is connected to the floor 604 by the bellows 115. An induction coil 608, supported by the chamber wall 602, surrounds the lid 606. A coil power supply 610 provides RF power to the coil 608 within the chamber 600. The coil power supply 610 provides approximately 100 to 600 watts at a frequency of between approximately 400 kilohertz (KHz) and 5 megahertz (MHz). An RF shield 605 surrounds the induction coil and prevents RF radiation from escaping into the environment outside the chamber 600.

A DC voltage, from the DC power supply 402 energizes the chuck electrodes 315*a* and 315*b* causing an electrostatic attraction between the wafer 101 and the susceptor 120. Backside gas from a source 616 flows through the tube 124 and the port 125. The backside gas fills interstitial spaces 618 between the wafer backside 103 and the chuck surface 123. The backside gas promotes heat transfer between the wafer 101 and the chuck 120. The foil 180 promotes heat transfer between the susceptor 120 and the cooling plate 113. A fluid, flowing in the cooling tubes 182, exchanges heat between the cooling plate 113 and the environment outside the chamber.

A process gas source 611 supplies an inert gas, such as argon, to the chamber. The coil 608 is energized to ionize the inert gas to form a plasma 612. A grounded, cylindrical aluminum shield 614 confines the plasma 612 to a region above the cathode assembly 101. Ions from the plasma 612 bombard the surface of the wafer 101. The cathode RF power supply 406 provides approximately 100 to 600 watts of power at a frequency of between approximately 1 and 100 MHz, preferably 13.56 MHz, to the cathode electrodes 315*a* and 315*b* in the susceptor. The power applied to the cathode controls the etch rate and the power applied to the coil controls the wafer bias. Optionally, the cathode and coil power together can be used to control the wafer bias.

Although various embodiments which incorporate the teachings of the present invention have been shown and described in detail herein, those skilled in the art can readily devise many other varied embodiments that still incorporate these teachings.

What is claimed is:

1. A cathode assembly comprising:
   a pedestal;
   a detachable susceptor disposed above said pedestal, said susceptor having a surface containing a contact plate and at least one electrode disposed within said susceptor, said contact plate coupled to said at least one electrode and having a surface exposed below said susceptor;
   a contact assembly having a first end and a second end, said contact assembly disposed in said pedestal, said first end detachably coupled to said exposed surface of said contact plate; and,
   a resilient contact strip coupled to the second end of said contact assembly.

2. The cathode assembly set forth in claim 1 further comprising a hook shaped surface electrode.

3. The cathode assembly set forth in claim 1 further comprising a rod coupled to said resilient contact strip.

4. The cathode assembly set forth in claim 1 further comprising
   a cooling plate disposed below the susceptor; and
   a thermally conductive foil disposed between said cooling plate and said susceptor.

5. The cathode assembly of claim 1 further comprising a clamp ring circumscribing and engaging the susceptor to secure said susceptor to said pedestal.

6. The cathode assembly set forth in claim 1 wherein said pedestal further comprises a housing, said resilient contact strip disposed within said housing.

7. The cathode assembly set forth in claim 6, wherein said housing is plastic.

8. The cathode assembly set forth in claim 1, further comprising a plurality of wafer supporting pads disposed on said susceptor.

9. The cathode assembly set forth in claim 8 further comprising an interconnect electrode that electrically connects certain ones of said plurality of pads.

10. The cathode assembly set forth in claim 1 wherein said contact assembly further comprises multiple self-loading conductive contacts disposed against said contact plate.

11. The cathode assembly set forth in claim 10 wherein said contact assembly comprises a plunger electrode and a canted spring disposed between said plunger electrode and said contact plate.

12. A cathode assembly comprising:
    a pedestal;
    a susceptor disposed above said pedestal, said susceptor having a first surface containing a contact plate and a second surface,
    a plurality of pads disposed on said second surface;
    a contact assembly having a first end and a second end, said contact assembly disposed in said pedestal, said first end detachably coupled to an exposed surface of said contact plate;
    a resilient contact strip disposed in said pedestal and coupled to said second end of said contact assembly; and,
    a clamp ring circumscribing said susceptor.

13. The cathode assembly set forth in claim 12 further comprising at least one electrode disposed on said second surface, wherein certain ones of said pads are disposed on said electrode.

14. The cathode assembly set forth in claim 13 further comprising at least one chuck electrode embedded within said susceptor.

15. The cathode assembly set forth in claim 14 wherein said contact assembly disposed in said pedestal provides conductive contacts between said resilient contact strip and said contact plate.

16. The cathode assembly set forth in claim 12 wherein said susceptor comprises a ceramic body having a peripheral flange and said clamp ring further comprises a plurality of inward projecting fingers that engage said flange.

17. A semiconductor wafer processing chamber, comprising:
    a floor;
    a set of walls attached to said floor;
    a lid mounted to said walls;
    a pedestal situated within said chamber;
    a susceptor detachably disposed above said pedestal, having a a contact plate disposed thereon, said contact plate having a first end and a second end, said susceptor having a plurality of pads and an interconnect electrode disposed on said surface wherein certain ones of said pads are disposed on said interconnect electrode;

a resilient contact strip disposed in said pedestal; and, a contact assembly having one end coupled to said resilient contact strip, wherein another end of said contact assembly makes electrical contact with said contact plate when said susceptor is attached to said pedestal.

18. The semiconductor wafer processing chamber set forth in claim 17 further comprising a clamp ring circumscribing said susceptor, having a plurality of inward projecting fingers that secures said susceptor to said pedestal.

19. The semiconductor wafer processing chamber set forth in claim 18 wherein said susceptor is an electrostatic chuck having first and second chucking electrodes.

20. The semiconductor wafer processing chamber set forth in claim 19 further comprising:

a DC power supply, coupled to said chucking electrodes and said interconnect electrode; and an RF power supply coupled to said chucking electrodes.

* * * * *

UNITED STATES PATENT AND TRADEMARK OFFICE
CERTIFICATE OF CORRECTION

PATENT NO. : 6,219,219 B1
DATED : April 17, 2001
INVENTOR(S) : Hausmann, et al.

It is certified that error appears in the above-identified patent and that said Letters Patent is hereby corrected as shown below:

<u>Title page,</u>
Item [75] should read as follows: -- Chia-Ao Bill Lu --

Signed and Sealed this

Twenty-fifth Day of September, 2001

*Attest:*

NICHOLAS P. GODICI
*Attesting Officer*     *Acting Director of the United States Patent and Trademark Office*